United States Patent [19]

Noschese

[11] Patent Number: 4,767,344
[45] Date of Patent: Aug. 30, 1988

[54] SOLDER MOUNTING OF ELECTRICAL CONTACTS

[75] Inventor: Rocco Noschese, Wilton, Conn.

[73] Assignee: Burndy Corporation, Norwalk, Conn.

[21] Appl. No.: 101,728

[22] Filed: Sep. 28, 1987

Related U.S. Application Data

[63] Continuation of Ser. No. 899,503, Aug. 22, 1986, abandoned.

[51] Int. Cl.⁴ .............................................. H01R 23/72
[52] U.S. Cl. ........................................ 439/83; 29/843; 228/180.1
[58] Field of Search ............... 339/17 R, 17 C, 275 R, 339/275 T, 275 B; 228/179, 180.1, 180.2; 29/839, 840, 843; 439/83, 876

[56] References Cited

U.S. PATENT DOCUMENTS

| | | | |
|---|---|---|---|
| 3,324,230 | 6/1967 | Sherlock | 339/275 T |
| 3,780,433 | 12/1973 | Lynch | 29/843 |
| 3,915,546 | 10/1975 | Cobaugh et al. | 339/275 B |
| 3,932,934 | 1/1976 | Lynch et al. | 29/843 |
| 4,505,035 | 3/1985 | Burton | 29/843 |
| 4,631,639 | 12/1986 | Biraud | 339/275 B |
| 4,663,815 | 5/1987 | Hartman et al. | 29/839 |

FOREIGN PATENT DOCUMENTS 2448296 4/1976 Fed. Rep. of Germany ....... 439/876

OTHER PUBLICATIONS

Electronics, Sized Solder Bumps Make Solid Joints, vol. 54, No. 22, p. 46, 11-3-1981.
International Technology Disclosures, vol. 3, No. 9, Document 98502, 9-1985.
One page advertisement, connections mfd. by TEKA Prod., Inc., new product announcement, EE Magazine, p. 30, 7-1986.

Primary Examiner—Neil Abrams
Attorney, Agent, or Firm—Perman & Green

[57] ABSTRACT

An electrical component having an elongated contact element provided with a premeasured bead of solder thereon such that, in reflow operation, it can be joined to a contact on another component. In one embodiment, the solder bead can be formed on the pins of a component adapted for mounting on a printed circuit board. In another embodiment, the solder bead is formed on a finger contact of a plug connector adapted to engage a surface contact on an associated daughter board. For both embodiments, the bead is formed by using a mold which assures that each bead contains a uniform amount of solder. The construction enables mixed technology to be mounted on a printed circuit board with both pin mounted components and surface mounted components to be mounted simultaneously in a reflow operation. The entire process resulting in the novel electrical component and in a device incorporating the novel electrical component is also disclosed.

10 Claims, 4 Drawing Sheets

SOLDER MOUNTING OF ELECTRICAL CONTACTS

This is a continuation of co-pending application Ser. No. 899,503 filed on 8-22-86 and now abandoned.

BACKGROUND OF THE INVENTION

I. Field of the Invention

This invention relates to improvements in solder mounting of electrical contacts and in a process enabling the mounting of electrical contacts in accordance with the invention.

II. Description of the Prior Art

It has become more and more commonplace for electronic components to be surface mounted on printed circuit boards (PCBs). This is for a number of reasons including the ability to achieve a higher density of components on a board and because it is easier for robots to be used and achieve the desired end results. At the same time, there remains a need for certain components still to be pin connected. This might occur, for example, when the density of pins does not allow for both pads and vias (that is, plated through holes used to contact circuits at various levels of a multi-level circuit board). Also, this might occur in multiple row connectors, as with a four row connector, in which it might be impossible to direct the middle two rows between the outer two rows so as to accomplish inspectable surface termination.

In such mixed technology PCB assemblies, however, there was a problem during the assembly operation since wave soldering is a preferred method of attaching pin mounts while reflow soldering is a preferred method for surface mounting. In a typical wave soldering operation, the underside of a printed circuit board to which a component has been attached with the pins extending through and beyond mounting holes provided therein, is advanced transversely toward a standing wave of molten solder. As the PCB advances, the solder wave envelopes the pins and, by reason of capillary action, the solder joins each pin with its associated metal plated hole in the PCB.

In a reflow operation which, as noted above, is generally utilized for surface mounting of components on a PCB, a layer of solder paste which is a slurry mixture of tin and lead powder, carrier material, and flux is then applied to the surface of the PCB. The contacts of a component to be mounted on the PBC are then pushed into the solder paste which is sufficiently thick and viscous to hold the component in place until a subsequent reflow operation is performed. In the reflow operation, the PCB, together with its component positioned thereon, is then heated to a temperature at which the solder in the solder paste melts, then resolidifies when heat is withdrawn from the assembly. When the assembly is cooled, the solder hardens with the result that the component is firmly mounted to the PCB in its desired location.

Because of the diversity of the two processes customarily used for mounting technology on a PCB, it was generally required, in those instances in which mixed technology was to be mounted on a PCB, to perform two separate steps in such a manner that the following step would not interfere with the results of the preceding step. It became customary, therefore, to first perform wave soldering in order to mount the components having pin contacts, then to perform a reflow operation for applying the surface mounted components to the PCB. However, it will be appreciated that the two step process just described is time consuming. Furthermore, even though precautions are taken, it is possible for the subsequent reflow operation to have a deleterious effect on the earlier solder wave operation. There is also the possibility of damage from heat or handling.

With the passage of time, therefore, it came to be recognized that it would be desirable to perform only one mounted operation for all components, whether they be of the surface mounted type or of the pin mounted type. In order to achieve this end, however, it was necessary to provide in each connector location a predetermined amount of solder and flux. This was achieved by means of solder pre-forms of various shapes and sizes which were applied to or placed adjacent the contacts preliminary to a reflow operation. For example, washer-shaped pre-forms were sometimes fashioned in successive layers, alternately, of flux and solder, then fittingly attached to a pin adjacent to a desired point of electrical connection. Sometimes a particular shape is due to application geometry, and sometimes merely a convenience for the pre-form vendor. Other typical pre-forms were square shaped and still others were resin core solder, that is, a long or continuous tube of solder surrounding a flux core. In this latter instance, short lengths of resin core solder would be cut off or formed and placed so as to be mechanically held by the connector pin of a component pending the reflow operation. An example of this is the Solder Bearing Lead (SBL) Series of connectors manufactured by Teka Interconnection Systems of Providence, R.I.

In another attempt to obtain a predetermined amount of solder on a contact tail, it was washed in a solution of a type repellent to solder. In this instance, the solder would only adhere to the non treated area. The contact tail was then passed through a solder bath or wave thereby in resulting in some measure of solder thereon, but the resulting globule of solder which adhered to the contact tail was not an accurately predetermined amount and would vary to a substantial extent from one contact tail to the next.

It was with knowledge of the current state of the art as represented by the technology just described that the present invention was conceived and has now been reduced to practice.

SUMMARY OF THE INVENTION

The present invention, then, is directed toward an electrical component having an elongated electrically conductive contact member provided with a premeasured bead of solder thereon such that, in a reflow operation, it can be joined to a contact member of another component. In one embodiment, the solder bead can be formed on the pins or other contact member of a component adapted for mounting on a printed circuit board. In another embodiment, the solder bead is formed on a finger contact to engage a surface contact on an associated daughter board. For both embodiments, the bead is formed by using a mold which assures that each bead contains a uniform amount of solder. The construction disclosed enables mixed technology components to be mounted on a printed circuit board with both pin mounted components and surface mounted components to be mounted simultaneously in a reflow operation. The entire process resulting in the novel electrical component and in a device employing the novel electrical component is also disclosed.

One feature of the invention thus resides in the provision of prelocated solder on component contacts for purposes of mounting the components on a PCB. Another feature resides in the ability to obtain a higher contact density on a PCB. Furthermore, the invention improves the quality of connections since the proper amount of solder is always utilized. Still another feature of the invention resides in the reduction or elimination of waste since each contact utilizes an identical amount of solder for the formation of the solder bead.

Other and further features, objects, advantages, and benefits of the invention will become apparent from the following description taken in conjunction with the following drawings. It is to be understood that the foregoing general description and the following detailed description are exemplary and explanatory but are not intended to be restrictive of the invention. The accompanying drawings which are incorporated in and constitute a part of this invention, illustrate one of the embodiments of the invention and, together with the description, serve to explain the principles of the invention in general terms. Like numerals refer like parts throughout the disclosure.

BRIEF DESCRIPTION OF THE DRAWINGS

FIGS. 11 and 12 are perspective and side elevation views, respectively, illustrating a step of applying a solder bead to contacts having the form of the embodiment illustrated in FIGS. 10 and 11.

DETAILED DESCRIPTION OF THE PREFERRED EMBODIMENTS

Figure 1:
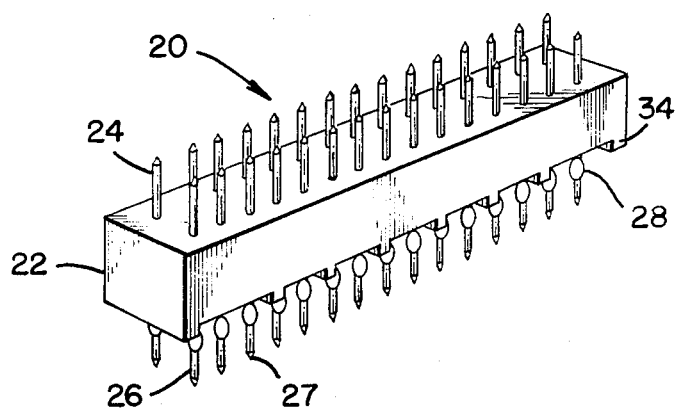
FIG. 1 is a perspective view of an electrical component embodying the invention.
Figure 2:
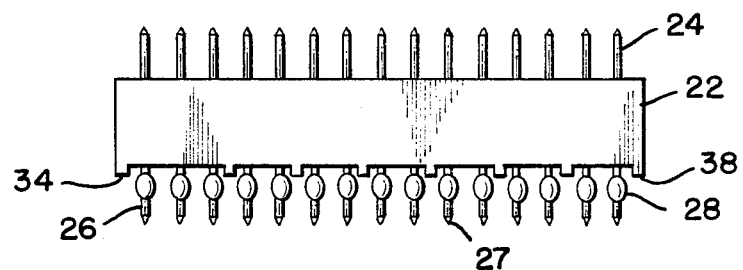
FIG. 2 is a side elevation view of the electrical component illustrated in FIG. 1.

Turn now to the drawings and initially to FIGS. 1 and 2 which illustrate an electrical component 20 which embodies the present invention. The component 20 can be of any standard construction, such as a dual inline pin having an insulative housing 22, incoming leads 24 and elongated electrically conductive pin contacts 26. Each pin contact 26 has a terminal end 27 distant from the housing 22 adapted for reception in mating holes of a second component (not illustrated in FIGS. 1 and 2).

Figure 3:
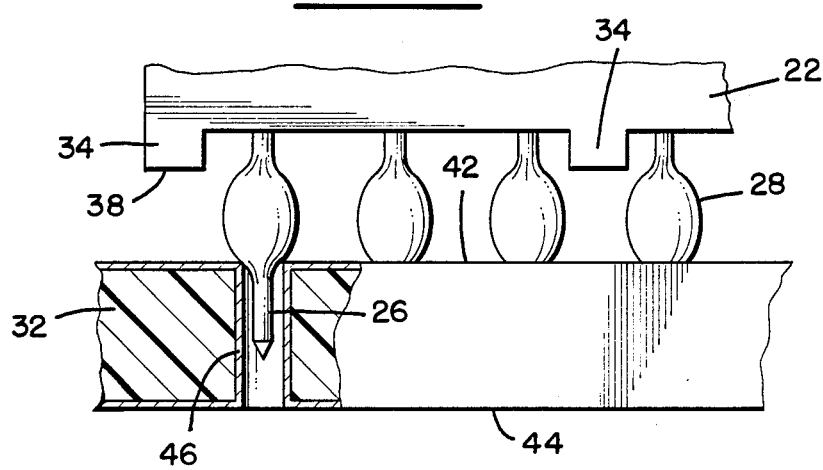
FIG. 3 is a detail side elevation view, certain parts being cut away and shown in section, illustrating the component illustrated in FIGS. 1 and 2 overlying a printed circuit board before a reflow operation.

As seen in FIGS. 1 and 2, each pin contact 26 has a premeasured bead 28 of solder formed thereon. The bead 28 encircles the pin contact and envelops a predetermined region along the length of the pin contact spaced from the terminal end 27. The reason for locating the premeasured bead 28 at a predetermined region along the length of the pin contacts 26 will now be explained. Turning to FIG. 3, the electrical component 20 with the premeasured beads of solder 28 already formed on the pin contacts 26 is illustrated with the terminal ends 27 inserted within associated holes 30 in a conventional printed circuit board 32. In this situation, the premeasured beads 28 are positioned intermediate to the housing 22 and the printed circuit board 32. Additionally, 15 the housing 22 is formed with one or more integral standoff members which extend outwardly from an outer surface 36 of the housing 22 and terminate at a bearing surface 38 spaced from the outer surface 36. Each premeasured bead 28 of solder has an extreme surface 40 more distant from the outer surface 36 than the bearing surface 38. Thus, with the electrical component 20 positioned on the printed circuit board 32 in the manner illustrated in FIG. 3, each extreme surface 40 of its associated premeasured bead 28 is substantially in engagement with an upper rim of its associated hole 32 in the printed circuit board.

Thereupon, in a reflow operation, the electrical component 20 and the printed circuit board 32 on which it is positioned, are appropriately heated, as in a suitable oven, to a temperature at which the solder in the premeasured beads 28 is caused to melt.

The printed circuit board 32 has first and second opposed surfaces 42 and 44, respectively, and it is desirable to apply flux beforehand to the interfaces between the holes 30 and the first surface 42 in a customary fashion. Each hole 30 may be provided with a spool-shaped copper plating 46 which, in a known manner, enables electrical continuity between the first and second opposed surfaces 42 and 44. Thereupon, each of the pin contacts 26 slides longitudinally through its associated hole 30 until the bearing surfaces 38 on the housing 22 engage the first opposed surface 42 of the printed circuit board 32. At this point, the terminal end 27 of each pin contact 26 extends beyond the second opposed surface 44. Melted solder 48 resulting from the premeasured bead 28 will have flowed by capillary action into its associated hole 30 to fill all voids therein between the printed circuit board, or the copper plating 46, and the pin contact 26.

Figure 5:
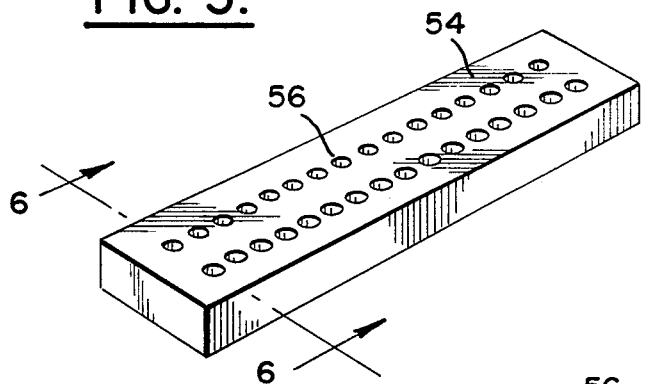
FIG. 5 is a perspective view of a mold suitable for forming solder beads on the pin contacts of the component illustrated in FIGS. 1 and 2.
Figure 4:
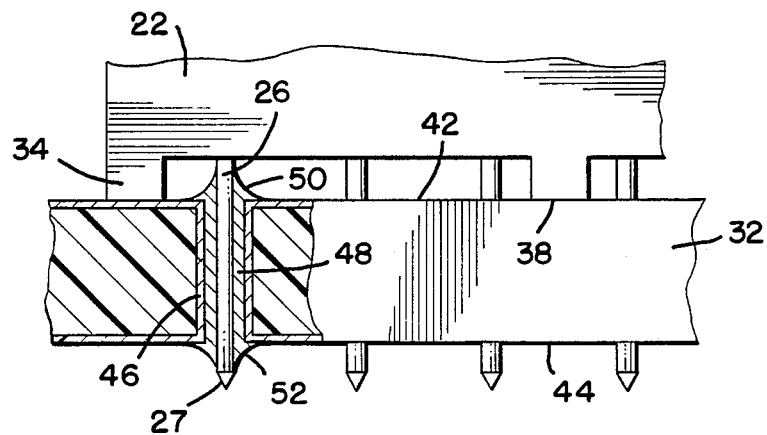
FIG. 4 is a detail cross-section view illustrating the component illustrated in FIGS. 1 and 2 with a contact pin which has be suitably joined to a printed circuit board following a reflow operation.

Viewing FIG. 4, the melted solder 48 defines a meniscus 50 at the region of interface between each of the pin contacts 26 and the surface 42. Similarily, a meniscus 52 is formed at the region of interface between the second surfacd 44 and each of the pin contact 26. The meniscuses 50 and 52 are important end results of the operation just described in that they provide a visual clue that the melted solder 48 has completely filled all voids present between the copper plating 46 and the pin contact 26. In short, the meniscuses represent a superb electrical connection. The construction illustrated in FIG. 4 therefore represents the final desired position of the electrical component 20 on the printed circuit board 32. The manner in which the premeasured bead 28 of solder is formed and properly located on a pin contact 26 will now be described with particular reference to FIGS. 5 and 6. To this end, a mold 54 is provided with a plurality of cavities 56 for efficiency of operation in a high production process. Of course, it will be appreciated that the concept of the invention is not altered whether the mold has one cavity or many cavities in it. A preferred material for the mold 54 is silicone rubber although other materials such as ceramics or metals could be used with appropriate modifications as will be described below. As seen in FIG. 5, each cavity 56 has a generally circular rim at its interface with an upper surface 58 and an annular champfered area 60 at its bottom nearest a lower surface 62 of the mold.

Each cavity 56 is filled with suitable solder paste which is in the form of a slurry composed of ground tin lead powder mixed with a suitable carrier with flux mixed in. The composition of the solder paste is conventional, one example suitable for purposes of the invention being that manufactured by Alphametals, Inc. of Jersey City, N.J. under the name "Solder Paste". It will be appreciated that the volume of each cavity 56 is precisely determined so that the amount of resulting solder in each premeasured bead 28 is of a proper and uniform size. In this manner, a bead of solder can be sufficiently large to assure that an excellent electrical contact will be made while simultaneously assuring that there will be no waste of solder by reason of the application of an excess amount of solder to a component.

Figure 6:
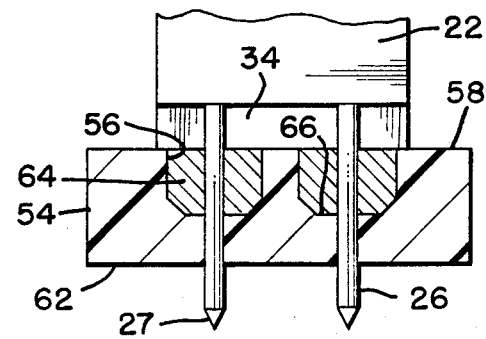
FIG. 6 is a detail cross-section view taken generally along line 6—6 in FIG. 5.

Thereupon, as seen in FIG. 6, there being as many cavities 56 as there are pin contacts 26, the housing 22 is advanced towards the mold 54 such that the terminal end 27 of each pin contact 26 passes through the solder paste 64 and generally centrally of the cavity 56. With continued movement of the housing 22 toward the upper surface 58 of the mold, the terminal end 27 of each pin contact 26 pierces a bottom surface 66 of a cavity 56 and, eventually, emerges from the mold 54 through the lower surface 62. Further relative movement of the housing 22 and the mold 54 is arrested when the bearing surfaces 38 of the stand off members 34 engage the upper surface 58 of the mold 54.

Figure 7:
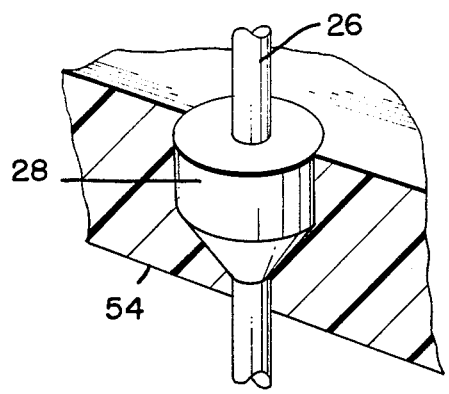
FIG. 7 is a detail cut away perspective view of a contact showing the shape of the solder bead before the solder is melted.
Figure 8:
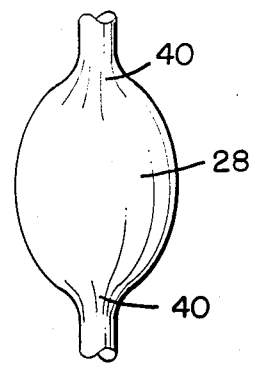
FIG. 8 is a detail perspective view of a pin with a solder bead formed thereon after removal from the mold and the solder has cooled and solidified.

With the electrical component 20 positioned on the mold 54 in the manner illustrated in FIG. 6, the assembly is heated, as in a suitable oven, to a temperature at which the solder paste 64 melts and becomes bonded to the pin contact 26 in a known manner. During the heating process, the carrier materials within the solder paste are evaporated and the flux material performs in a known fashion to assure that an excellent bond will result between the solder and the pin contact. Initially, the premeasured bead 28 of solder is generally of diskshape as illustrated in FIG. 7. However, after melting and subsequent cooling, while the pin contact remains engaged with the mold 54, the bead 28 assumes a generally teardrop configuration as illustrated in FIG. 8 having the extreme surfaces 40 at both ends as previously described.

It was previously explained that the mold 54 can be composed of materials other than a resilient material such as silicone rubber. For example, it can be composed of ceramic material or be metallic. However, in either instance, it would be necessary for purposes of the invention, to provide a resilient, self sealing insert in the region of each cavity 56 between the bottom surface 66 of each cavity and the lower surface 62 of the mold 54. In this manner, the terminal end 27 of a pin contact 26 could easily pierce the bottom surface 66, and the material surrounding the pin contact would assure a proper seal which would prevent the solder paste 64 from flowing out of the cavity 56. Furthermore, such an insert would assure that upon subsequent withdrawl of the electrical component 20 and each pin 26 from the mold 54, the hole which was pierced by the terminal end 27 would be sealed enabling the cavity 56 to receive a fresh supply of solder paste for a successive operation.

Figure 9:
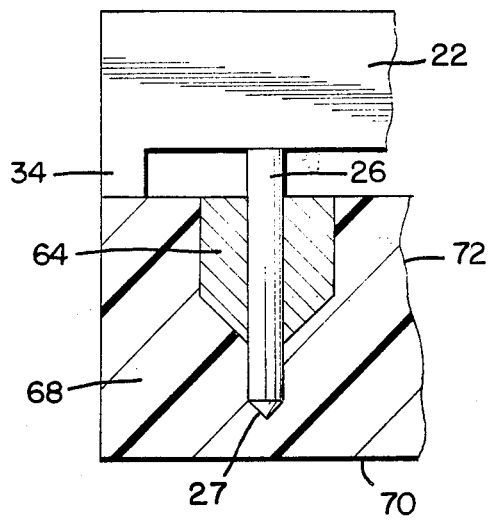
FIG. 9 is a detail cross-section view, similar to FIG. 6 but illustrating another embodiment of the invention.

A modified mold 68 is illustrated in FIG. 9 which is generally similar to the mold 54 but of sufficient thickness that the terminal end 27 of a pin contact 26 does not extend beyond a lower surface 70 during the molding process when the stand off members 34 engage an upper surface 72 of the mold. As with the mold 54, the material of which the mold 68 is composed would preferably be such that the solder paste 64 would not flow out of its cavity 74 either when the pin contact 26 is in the inserted position as illustrated in FIG. 9 or subsequently when it has been removed from the mold.

Another embodiment of the invention is disclosed herein with particular reference to FIGS. 10-13. This embodiment is concerned with application of the concept of the invention to surface mounted components rather than to pin mounted components as in the previous embodiment. Viewing initially FIGS. 10 and 11, an electrical assembly embodying the invention is illustrated which includes a first component, or plug connector 76, and a second component, or daughter board 78. The plug connector 76 is provided with a plurality of pairs of contact members which are engagable, respectively, with contact surfaces on the daughter board 78. Specifically, an elongated electrically conductive first contact member 80 extends from the plug connector 76 toward a terminal end 82 and another first contact member 84, longer than the first contact member 80, extends to a terminal end 86 distant from the plug connector. The terminal ends 82 are physically engaged with associated second passive contact members 88 and, similarly, the terminal ends 84 are physically engaged with associated second passive contact members 90 formed on a surface of the printed circuit board 78. In a manner which will be described below, a premeasured bead 92 of solder is formed at the terminal ends 82 and 86 so as to completely encircle the contact members 80 and 84 and envelop a predetermined region along the length of contact member.

Figure 11:
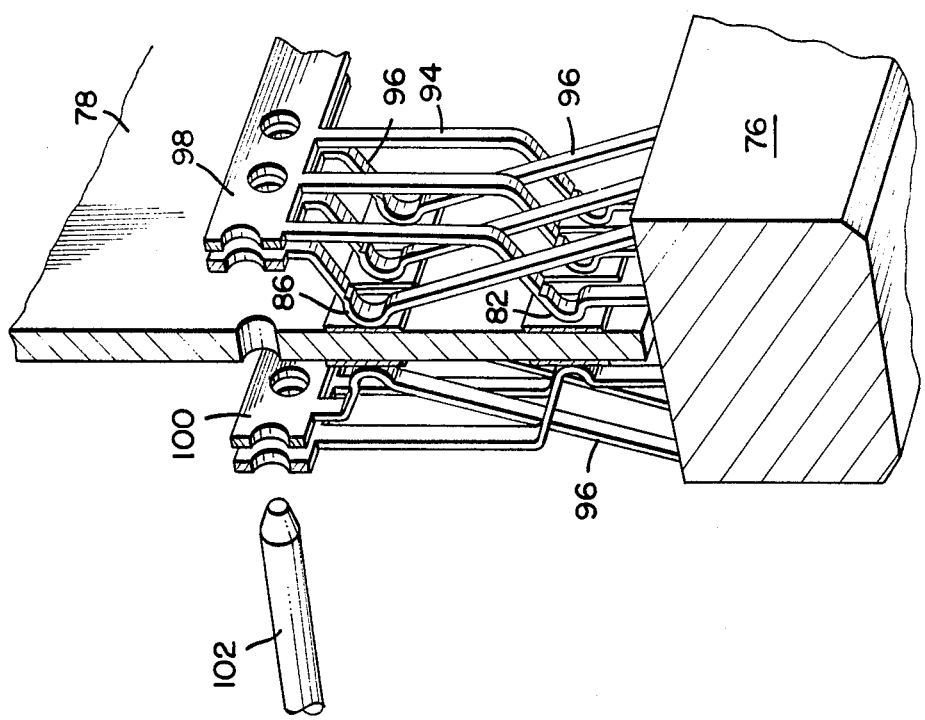
FIG. 11 is a perspective view, certain parts being cut away and shown in section, illustrating the embodiment of FIG. 10.
Figure 10:
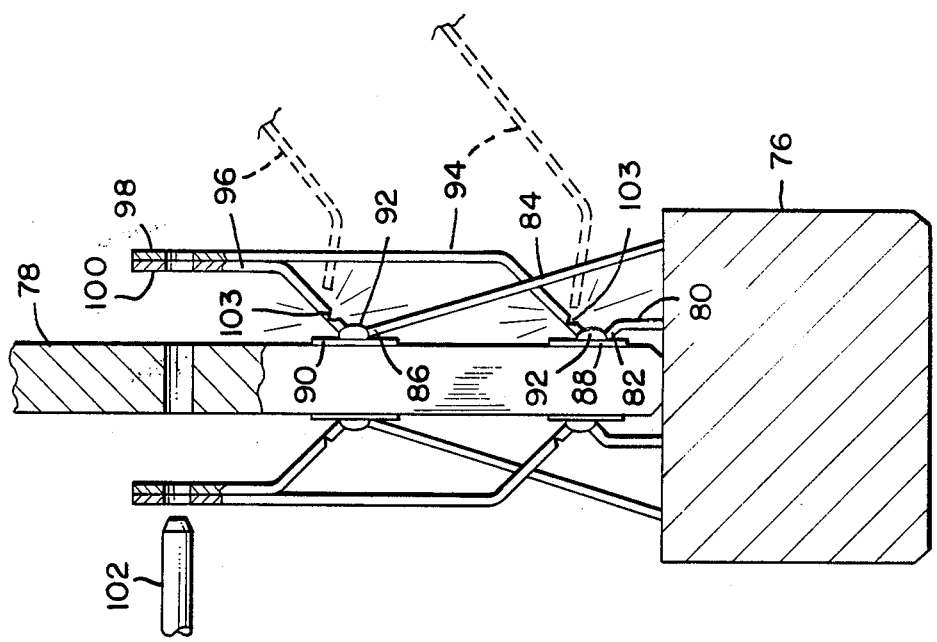
FIG. 10 is an end elevation view, certain parts being cut away and shown in section, illustrating another embodiment of the invention.

As seen in FIGS. 10 and 11, each of the active contact members 80 and 84 is provided with an extension 94 and 96, respectively, which is integral with an associated carry strip 98 and 100, respectively. A suitable tool 102 is engageable with appropriately positioned holes formed in the daughter board and in the carry strips to assure the proper relative positioning of the contact members 80, 82, 86, and 90. With the tool 102 performing its aforesaid function, the entire assembly is heated as in an oven to a temperature at which the solder in the premeasured beads 92 is caused to melt. By capillary action, the molton solder from each bead 92 is caused to flow to thereby mechanically and electrically join terminal ends 82 to their associated passive contact members 88 and terminal ends 86 to their associated passive contact member 90. Upon the removal of heat from the assembly, the carry strips 98 and 100 and their associated extensions 94 and 96 are broken, as at weakened locations 103, from their associated contact members and removed from the assembly. In this manner, numerous painstaking successive soldering operations are avoided. Instead, a large number of electrical connections are achieved in one simplified operation.

Figure 12:
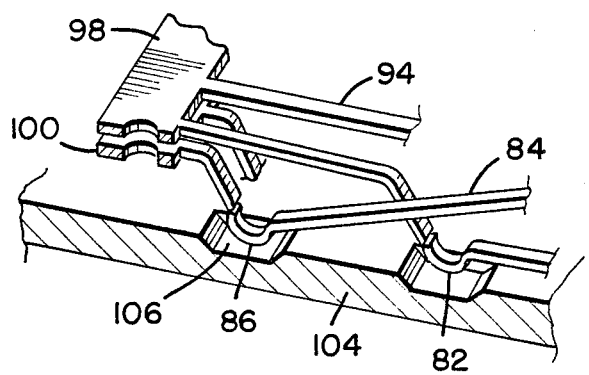
Figure 13:
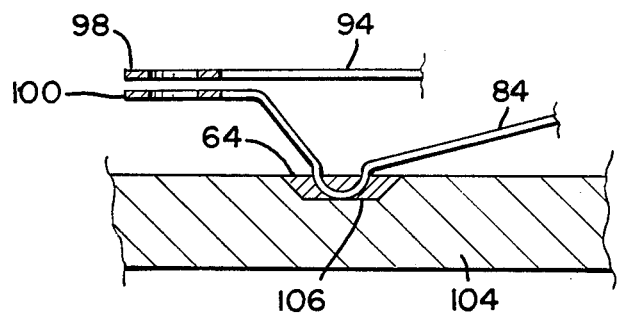

The operation of forming the premeasured bead 92 of solder on each contact member will now be described with the aid of FIGS. 12 and 13. As seen in those figures, a mold 104 has a plurality of open faced cavities 106 formed adjacent an upper surface 108 thereof. The material of which the mold 104 is composed may be of any suitable composition and need not be restricted as in the instance of the mold 54.

Each cavity 106 is filled with solder paste 64 having the composition previously described. Since each active contact member 80 and 84 includes extensions 94 and 96, respectively, and carry strips 98 and 100, respectively, it is not possible to pierce a bottom surface of the cavity 106 as in the preceding embodiment. Accordingly, in this instance, the active contact members 80 and 84 are moved laterally so that a curved length of the contact member is caused to dip into the solder paste 64 within the cavity 106. As in the instance of the preceding embodiment, the contact members are held at predetermined positions relative to the mold 104 to assure the proper positioning of the bead 92 of solder on each contact member. The assembly comprising the contact members and the mold is then heated, as in a suitable oven, to a temperature at which the solder paste 64 melts and at which the volatile ingredients of the solder paste are driven off. The remaining solder forms the bead 92 in a fashion in which it completely encircles the contact member. Thereupon, the assembly is removed from the oven and the contact members 80 and 84 are removed from the mold 104 with a premeasured bead 92 in place thereon.

While the preferred embodiments of the invention have been disclosed in detail, it should be understood by those skilled in the art that various modifications may be made to the illustrated embodiments without departing from the scope as described in the specification and defined in the appended claims.

What is claimed is:

1. An electrical component with an insulation housing comprising:
    at least one elongated electrically conductive pin contact attached to the housing and having a terminal end extending outwardly therefrom adapted for reception in a mating hole of a second component, said pin contact having a hardened bead of solder of predetermined magnitude and defined shape laterally formed thereon and adhering thereto completely encircling said pin contact and enveloping a predetermined region along the length of said pin contact spaced from said terminal end, said pin contact assuming an initial position with said bead of solder being engageable with the second component at the hole, positioning said pin contact centrally thereof, said pin contact being movable to a final position when molten solder from said solder bead is heated past the melting temperature and is caused to flow along and around said pin contact toward said terminal end and into the hole of the second component thereby mechanically joining said pin contact to the second component, the predetermined magnitude being the precise amount of solder needed to completely fill the hole and form a meniscus at each interface between said pin contact and the second component, the solder bead being located on said pin contact to space said housing away from the second component and so that, upon being heated to fill the hole, said housing is drawn into engagement with the second component.

2. An electrical device comprising:
    a first component with an insulative housing having an outer surface and including at least one elongated electrically conductive pin contact having a terminal end extending beyond said outer surface;
    a second component adapted to be joined to said first component having at least one hole therein positioned for slidable reception of said pin contact therethrough, a rim being defined at the interface between the hole and said outer surface; and
    a hardened bead of solder of predetermined magnitude and defined shape intergrally formed on and adhering to said pin contact so as to completely encircle said pin contact and envelop a predetermined region along the length of said pin contact, said pin contact assuming an initial position extending into the hole with said bead being positioned intermediate said first and said second component and engaged with said rim, said pin contact being movable longitudinally to a first position within the hole when said electrical device is heated to a temperature at which said bead melts, in a reflow operation, and said solder therefrom flows by capillary action into the hole filling all voids therein between said pin contact and said second component thereby mechanically joining said pin contact to the second component and defines a meniscus at each region of interface between said pin contact and said second component, the predetermined magnitude being the precise amount of solder needed to completely fill the hole and form a meniscus at each interface between said pin contact and said second component, said solder bead being located on said pin contact to space said housing away from said second component and so that, upon being heated to fill the hole, said first component is drawn into engagement with said second component.

3. An electrical device as set forth in claim 2 including:
    a standoff member integral with said first component and extending outwardly therefrom generally in the direction of said pin contact adapted to engage said second component following the reflow operation.

4. An electrical device as set forth in claim 3:
    wherein said bead of solder has an extreme surface distant from said outer surface of said first component; and
    wherein said standoff member has a bearing surface distant from said outer surface of said first component, said extreme surface being spaced from said outer surface by a greater distance than said bearing surface, said bearing surface being engaged with said second component following the reflow operation.

5. An electrical device as set forth in claim 2:
    wherein said second component has first and second opposed surfaces, said first surface facing said outer surface of said first component; and
    wherein the hole extends transversely therethrough between said first and second surfaces; and
    wherein, following the reflow operation, said terminal end extends beyond said second surface and said solder defines a meniscus at the regions of interface between said pin contact and said first and second surfaces.

6. An electrical device as set forth in claim 5: wherein said second component is a printed circuit board.

7. In a printed circuit board assembly of the type adapted to receive both surface mounted components and pin mounted components and having a plurality of holes therethrough for slidable reception of said pin mounted components, the improvement comprising:

each of said pin mounted components having an insulative housing with an outer surface and including a plurality of electrically conductive elongated pin contacts having terminal ends extending beyond said outer surface;

a hardened bead of solder of predetermined magnitude and defined shape intergrally formed on and adhering to each of said pin contacts so as to completely encircle said pin contact and envelop a predetermined region along the length of said pin contact, said bead being initially spaced from said terminal end and positioned intermediate said component and said printed circuit board with said terminal end received in an associated hole in said printed circuit board, a rim being defined at the interface between each of the holes and said outer surface, said pin contact assuming an initial position extending into the hole with said bead engaged with said rim, said pin contact being longitudinally movable to a final position within the hole when said assembly is heated to a temperature at which said bead melts, in a reflow operation, and said solder therefrom flows by capillary action into the associated holes filling all voids therein betweein each said pin contact and said printed circuit board thereby mechanically joining said pin contact to said second component and defines a meniscus at each region of interface between said pin contacts and said printed circuit boards, the predetermined magnitude being the precise amount of solder needed to completely fill the hole and form a meniscus at each interface between said pin contact and the second component, said solder bead being located on said pin contact to space said housing away from said printed circuit board and so that, upon being heated to fill the hole, said housing is drawn into engagement with said printed circuit board.

8. An electrical component with an insulative housing comprising:

at least one elongated electrically conductive contact member having a terminal end extending outwardly therefrom adapted for reception in a mating hole of a second component to engage a mating contact member on the second component, said contact member having a hardened bead of solder of predetermined magnitude and defined shape integrally formed thereon and adhering thereto and completely encircling said contact member and enveloping a predetermined region along the length of said contact member such that when said electrical component is heated to a temperature at which said bead melts, in a reflow operation, said solder therefrom flows by capillary action so as to mechanically join together said contact member and its mating contact member, the predetermined magnitude being the precise amount of solder needed to completely fill the hole and form a meniscus at each interface between said pin contact and the second component, said solder bead being located on said contact member to space said housing away from the second component and so that, upon being heated to fill the hole, said housing is drawn into engagement with the second component.

9. An electrical device comprising:

a first component with an insulative housing including at least one electrically conductive first contact member having a terminal end extending outwardly therefrom;

a second component adapted to be electrically joined to said first component having a hole therein with at least one electrically conductive second contact member thereon; and a hardened bead of solder of predetermined magnitude and defined shape integrally formed on and adhering to said first contact member so as to completely encircle said first contact member and envelope a predetermined region along the length of said first contact member;

said first contact member receivable in the hole and engageable with said second contact member proximate to said bead of solder such that when said electrical device is heated to a temperature at which said bead melts, in a reflow operation, said solder therefrom flows by capillary action so as to mechanically join together said first and said second contact members, the predetermined magnitude being the precise amount of solder needed to completely fill the hole and form a meniscus at each interface between said pin contact and said second component, said solder bead being located on said first contact member to space said housing away from said second component and so that upon being heated to fill the hole, said first component is drawn into engagement with said second component.

10. An electrical device as set forth in claim 9 wherein said first component is a mother board and wherein said second component is a daughter board.

* * * * *